Sept. 26, 1961 J. A. BAIRD 3,002,109

AMPLIFYING TRIGGER CIRCUIT

Filed March 1, 1957 2 Sheets-Sheet 1

INVENTOR
J. A. BAIRD
BY
Walter M. Hill
ATTORNEY

Sept. 26, 1961 J. A. BAIRD 3,002,109

AMPLIFYING TRIGGER CIRCUIT

Filed March 1, 1957 2 Sheets-Sheet 2

INVENTOR
J. A. BAIRD
BY
Walter M. Hill
ATTORNEY

United States Patent Office 3,002,109

Patented Sept. 26, 1961

3,002,109

AMPLIFYING TRIGGER CIRCUIT

Jack A. Baird, Whippany, N.J., assignor to Bell Telephone Laboratories, Incorporated, New York, N.Y., a corporation of New York Filed Mar. 1, 1957, Ser. No. 643,474

16 Claims. (Cl. 307—88.5)

This invention pertains to electrical trigger circuits, and particularly to a trigger circuit which is also adapted to serve as an amplifier for signal amplitudes below that at which triggering occurs.

Trigger circuits find wide application in digital information systems, as routing switches, and as discontinuous controlling and indicating devices. Their distinguishing characteristic is that they will respond to an electrical signal having an amplitude above a minimum threshold level by undergoing an abrupt and often discontinuous change in their normal operating voltages and currents. Generally two different operating states are involved, the circuit being adapted to be "triggered" from one state to another in response to such a minimum amplitude "triggering" signal. A more complete description of trigger circuits and their behavior may be found in chapter 12 of the textbook "Transistors Electronics" by Lo et al., Prentice-Hall Incorporated, 1955, and in chapter 9 of the textbook "Electronic Engineering" by Seely, McGraw-Hill Book Company, Incorporated, 1956.

The threshold triggering level must be reasonably greater than zero to assure circuit stability, as otherwise oscillation between opposing states or spurious triggering could occur. In many cases, however, this results in a threshold triggering level greater than the maximum amplitude of the available signal with which it is desired to control the trigger circuit. In such cases it is necessary to provide an amplifier in advance of the trigger circuit itself, thereby reducing the threshold triggering level for input signals to the amplifier by a factor equal to the amplifier gain but still isolating the trigger circuit from disturbances that might cause spurious triggering. This adds considerably to the bulk, complexity and expense of the complete system. In addition, all during the time that the amplitude of the input signal is below the threshold triggering level both the amplifier and the trigger circuit are simply in "stand-by" operation, serving no useful function.

An approach to a solution to this problem has been made with multistate circuits utilizing a plurality of vacuum tube amplifiers connected in cascade and having a number of opposing negative and positive feedback loops which become effective at various signal amplitude levels. Patent 2,651,717, issued on September 8, 1953, to A. M. Uttley et al., is illustrative of such arrangements. A circuit of this type can serve as a signal amplifier besides being capable of assuming a new stable operating condition when the applied signal exceeds one of several predetermined threshold amplitudes. However, because such a circuit has stable operating conditions only, subsequent input signals of the same threshold amplitude do not produce a change in the operating condition of the circuit. Therefore, although the circuit may be utilized for registering the reception of different input signals it is incapable of registering the reception of a signal identical to the one received immediately prior thereto.

Accordingly, an object of this invention is to provide an amplifying trigger circuit which operates as an amplifier for applied signal amplitudes below a predetermined threshold triggering level and which undergoes an abrupt transition to a new operating state at greatly different currents and voltages for a predetermined interval each time the amplitude of the applied signal reaches that level.

A further object is to provide an amplifying transistor trigger circuit which operates at relatively low current levels while serving as an amplifier prior to being triggered, and which abruptly produces a large amplitude current when triggered.

In one embodiment the invention comprises three amplifiers connected in cascade. One amplifier serves as part of a stabilizing negative feedback loop. Two of the amplifiers, which may or may not include the one in the negative feedback loop, are connected by a positive feedback path. These two amplifiers are transistors of mutually opposite conductivity. Voltage sensitive switching means is provided in the positive feedback path to prevent transmission therein so long as the amplitude of the input signal voltage applied to the circuit is below a predetermined threshold level. The circuit then behaves as a conventional linear cascade amplifier, and operates at low power dissipation because the current conducted by each amplifier in the cascade is very small. The output voltage supplied to a load connected to one of the transistor amplifiers is then an amplified replica of the input signal voltage. However, if the amplitude of the signal voltage should reach the threshold voltage level, the output voltage of one of the amplifiers in the positive feedback loop becomes sufficient to cause the voltage sensitive switching means to permit transmission around that loop. The transistor amplifiers are then rapidly driven to a state of maximum current conduction, producing an extremely large amplitude load voltage and current. The duration of this current will depend on the time constants of the coupling elements between the various amplifiers, and so can be set at a desired value by the appropriate choice of the values of those elements.

Other features of the invention are set forth in the following detailed specification and accompanying drawings, in which.

Figure 1:
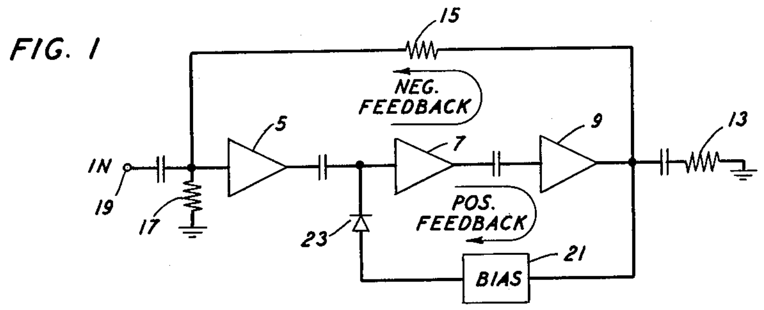
FIG. 1 is a block diagram showing the principles of one type of transistor trigger circuit constructed in accordance with the invention.

In FIG. 1 three linear amplifiers 5, 7 and 9 are connected in cascade in that order, the output terminal of the last amplifier 9 being connected through a blocking capacitor to a load 13. The output terminal of amplifier 9 is further connected via a resistor 15 to the input terminal of the initial amplifier 5. By shunting the input terminal of amplifier 5 to ground by a resistor 17 which is much smaller than resistor 15, a voltage division is effected whereby a small fraction of the output of the amplifier 9 is degeneratively fed back to the input terminal of amplifier 5. The circuit input terminal 19 is connected through a blocking capacitor to the input terminal of amplifier 5. Amplifiers 7 and 9 comprise transistors of opposite conductivity, and are designed to normally operate in a condition of low current conduction. Positive feedback of the output of amplifier 9 to amplifier 7 is established by connecting the output terminal of amplifier 9 to the input terminal of amplifier 7 through a path which includes switching means comprising a bias unit 21 and a diode 23. Bias unit 21 is designed to apply a bias voltage to diode 23 which prevents it from conducting so long as the amplitude of the output voltage of amplifier 9 is below a value corresponding to a predetermined input signal voltage triggering level $v_t$. When the amplitude of the signal voltage applied at input terminal 19 exceeds triggering level $v_t$, the bias voltage is overcome and diode 23 becomes conductive. The output voltage of amplifier 9 is then regeneratively fed back to the input terminal of amplifier 7, causing each of those amplifiers to be rapidly driven to their condition of maximum current conduction. A sudden large amplitude pulse of current is thereby produced in load 13. This condition persists for a time established by various capacitive charging paths present in the couplings between amplifiers 7 and 9 and/or in the positive feedback path.

This triggering behavior, whereby each of amplifiers 7 and 9 becomes highly conductive, is a consequence of utilizing transistors of opposite conductives. In contrast, with trigger circuits comprising two vacuum tube amplifiers, one amplifier is inevitably at or close to cutoff when the other is in the condition of maximum conduction. In such trigger circuits the production of a large output current when triggering occurs necessitates the maintenance of a large continuous current in one of the amplifiers during the time prior to triggering. In addition, since the output impedance of a transistor is much lower than that of a vacuum tube, a transistor trigger circuit can operate with a load of much smaller impedance.

Considering the behavior of the block diagram of FIG. 1 in response to an alternating signal voltage applied to input terminal 19, so long as the peak amplitude of this signal voltage does not exceed the triggering level $v_t$ bias unit 21 maintains diode 23 nonconducting and the voltage produced across load 13 is an amplified replica of the signal voltage. That is, the circuit then behaves as a conventional cascade linear amplifier. The degenerative feedback path serves to stabilize the circuit gain in spite of slight variations in the characteristics of amplifiers 5, 7 and 9, and so to accurately maintain triggering level $v_t$ constant. If now the amplitude of the signal voltage increases to the level $v_t$, positive feedback is initiated between the output terminal of amplifier 9 and the input terminal of amplifier 7, as described above, and a large amplitude pulse of current is produced in load 13. The order of magnitude of the positive feedback voltage once triggering occurs is much greater than that of the negative feedback voltage, so that the latter is inconsequential in its effect in the circuit once the former is operative.

Figure 2:
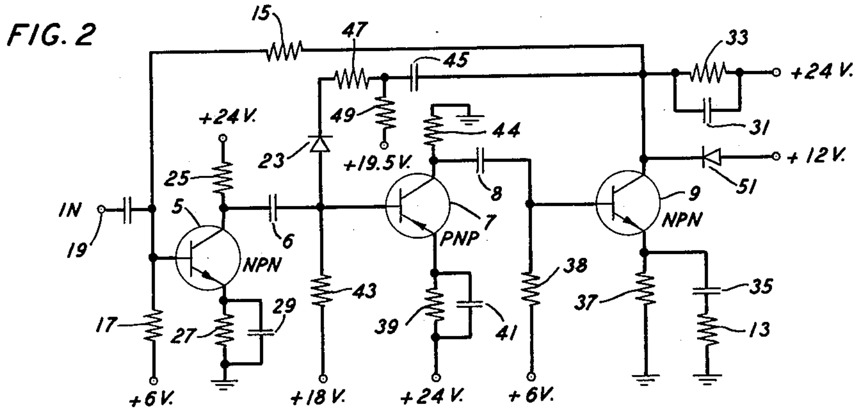
FIG. 2 is a diagram of a transistor trigger circuit constructed in accordance with the block diagram of FIG. 1, and adapted to serve as a gate between an auxiliary source of power and a load.

In FIG. 2 is shown a particular circuit embodying the operating principles of the block diagram of FIG. 1. Amplifiers 5, 7 and 9 are, respectively n-p-n, p-n-p, and n-p-n junction transistors. While, in theory, point contact transistors could be used, since their maximum current carrying capacity is so much more limited, the junction transistor is preferable. In accordance with convention, the emitter of each transistor is marked with an arrow pointing in the current flow direction consistent with the transistor conductivity. Each transistor could be replaced by one of opposite conductivity so long as the polarities of all supplied voltages in the circuit, as described hereinafter, were reversed. Transistors 7 and 9 must be of opposite conductivity, and to prevent unnecessary current dissipation in transistor 5 after triggering occurs it should be of the same conductivity as transistor 9.

The collector of input transistor 5 is connected through a blocking capacitor 6 to the base of transistor 7, the collector of the latter being connected through a blocking capacitor 8 to the base of transistor 9. The collector of transistor 5 is also connected by a resistor 25 to a source of +24 volts relative to ground. The emitter of transistor 5 is connected to ground by a resistor 27 which is by-passed to alternating current by a capacitor 29. The base of transistor 5 is connected by a resistor 17 to a source of +6 volts to ground. Since transistor 9 is of the same conductivity as transistor 5, it is connected in substantially the same way except that a small pulse "speed-up" capacitor 31 shunts collector resistor 33 to reduce the time required for the circuit to change state in response to a triggering voltage. One terminal of load resistor 13 is connected to the emitter of transistor 9 by a coupling capacitor 35, the other terminal of resistor 13 being grounded. The emitter of transistor 9 is connected to ground by a resistor 37, while the base is connected to a source of +6 volts to ground by a resistor 38. With regard to p-n-p transistor 7, its emitter is connected to the source of +24 volts to ground by a resistor 39 which is by-passed to alternating current by a capacitor 41. The base of transistor 7 is connected to a source of +18 volts to ground by a resistor 43, while the collector is connected to ground by a resistor 44.

Note that in the case of each of transistors 5, 7 and 9 the total direct voltage applied between the resistor connected to the base and the resistor connected to the emitter is 6 volts in the proper direction to cause the transistor to conduct. Also, the total direct voltage applied between the resistor connected to the base and that connected to the collector is 18 volts in the proper direction for operation of the transistor as an amplifier. With the addition of a resistor 15 connecting the collector of transistor 9 to the base of transistor 5, a complete cascade amplifier with negative feedback around all stages is established. By making resistor 15 large in comparison with the resistance of the parallel combination of resistor 17 and the base-to-emitter path of transistor 5, a voltage division is effected whereby only a small fraction of any voltage change which occurs at the collector of transistor 9 is fed back to the base of transistor 5. Also, due to the phase inversion between the alternating voltages at the base and the collector of a transistor, the alternating voltage at the collector of transistor 9 is in phase opposition to the alternating voltage at the base of transistor 5. The described feedback is, consequently, negative, and so tends to stabilize the entire circuit against variations in net gain due to variations in the operating characteristics of the transistors. When operating as linear amplifiers the current conducted by each of the transistors is relatively small and so involves little power dissipation. In this condition an input signal voltage is linearly amplified and produced across load 13. A positive feedback path is established in the circuit of FIG. 2 by connecting the collector of transistor 9 to the base of transistor 7 through the series combination of a blocking capacitor 45, a resistor 47, and a negatively poled diode 23. The junction of capacitor 45 and resistor 47 is connected by a resistor 49 to a source of +19.5 volts to ground. In the absence of any signal voltage at input terminal 19, the anode of diode 23 is subjected to approximately +18 volts and the cathode to +19.5 volts. A net bias of about 1.5 volts then exists across the diode in the nonconducting direction. Accordingly, the combination of capacitor 45 and resistors 47 and 49, together with the +18 and +19.5 direct voltage sources, serve the function of bias unit 21 described above with reference to FIG. 1.

The collector of transistor 9 is further connected to a source of +12 volts to ground by a diode 51 which is poled to conduct current toward the collector. Since collector resistor 33 is returned to +24 volts to ground, the collector voltage of transistor 9 while it performs as a linear amplifier is greater than +12 volts. Diode 51 is then subjected to a net bias in the nonconducting direction, and neither it nor the +12 volts source has an effect on the circuit operation.

During positive half cycles of an alternating input signal voltage applied to input terminal 19, the potential of the collector of transistor 9 will drop. The alternating voltage existing at the junction of capacitor 45 and resistor 47 is virtually the same as that at the collector of transistor 9, since capacitor 45 is a large blocking capacitor. However, so long as the amplitude of the alternating voltage at the collector of transistor 9 is less than 1.5 volts, the net voltage across diode 23 will still be in a direction which prevents the latter from conducting. If the amplitude of the alternating signal voltage should become at least equal to a threshold triggering voltage level $v_t$ during a positive half cycle of the signal, the potential of the collector of transistor 9 will be reduced by at least 1.5 volts and diode 23 will be rendered conductive. The negative pulse at the collector of transistor 9 is then applied to the base of transistor 7. Since the latter transistor is of the p-n-p type conductivity, a reduction in its base voltage increases the collector current and so increases the collector voltage to ground. This positive pulse is conveyed by capacitor 8 to the base of transistor 9, and since the latter is of n-p-n conductivity the current flow to its collector is also increased. This reduces the collector voltage of transistor 9 still further, so that a regenerative switching action occurs which produces an abrupt large amplitude drop in the voltage of the collector of transistor 9 and greatly increases the current flowing to the collector and out of the emitter. When the collector voltage drops to +12 volts diode 51 conducts. By then the resistance between the collector and emitter of transistor 9 will be very small as a result of the large positive base voltage, and virtually the full +12 volts is suddenly produced across the load 13. A large amplitude pulse of both voltage and current is thereby developed at load 13.

As soon as the described triggering action is initiated, capacitor 45 begins to be charged by the +19.5 volt source in a path including resistor 49 and the collector-to-emitter impedance of transistor 9. Capacitor 8 also begins to be charged by the +24 volt source in a path including resistor 39, the collector-to-emitter impedance of transistor 7, and the parallel impedance of resistor 38 and the base-to-ground impedance of transistor 9. This tends to stop transmission of feedback voltage between transistors 7 and 9, transmission being actually terminated when either of these capacitors has substantially fully charged. The voltage of the base of transistor 7 will by then have risen, reducing the current flow and voltage at its collector. Also, the base voltage of transistor 9 will have been reduced, reducing the current flow and voltage at its collector. The circuit thereby resumes to its original operating state wherein transistors 7 and 9 only conduct relatively small currents. These charging paths, and also that comprising capacitor 35 in series with load 13, determine the duration of the voltage and current pulse produced at load 13. By changing the sizes of the various capacitances and resistances involved, as described, the pulse duration can be set at a desired value. As will be obvious to those skilled in the electric circuit arts, an indefinitely stable triggered condition can be attained by substituting direct couplings for the described capacitive couplings. For example, an isolating diode could be substituted for capacitor 45, and capacitors 8 and 35 could be eliminated or replaced by resistors.

Figure 3:
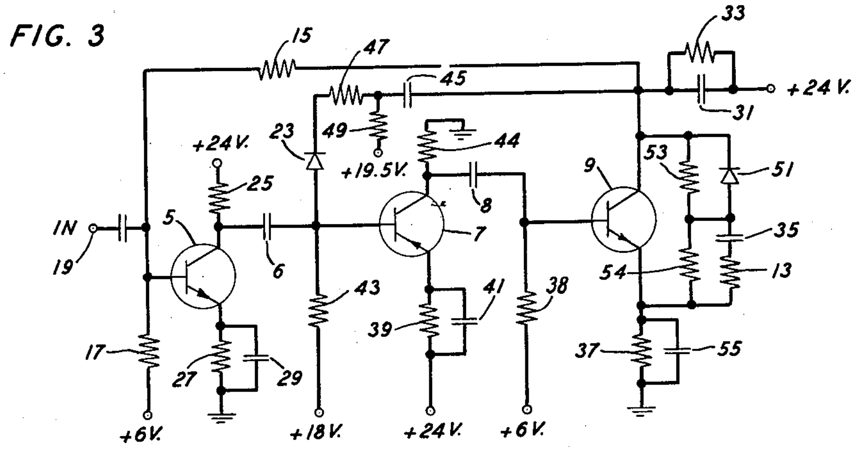
FIG. 3 is a diagram of a modification of the circuit of FIG. 1 for supplying power to a load without use of an auxiliary power source.

In FIG. 3 is shown the circuit diagram of a trigger circuit substantially the same as that of FIG. 2 except that, instead of utilizing transistor 9 to serve as a gate between an auxiliary +12 volts source and load 13, it is utilized to charge a capacitor which is suddenly discharged through the load when the circuit is triggered. The elements of FIG. 3 which are the same as those of FIG. 2 have been identified with the same reference numerals. The series combination of load 13 and capacitor 35 is connected at one terminal to the emitter of transistor 9 and at the other terminal to the anode of a diode 51 the cathode of which is connected to the collector of transistor 9. A voltage divider comprising a pair of resistors 53 and 54 in series is connected across the emitter-to-collector path of transistor 9, the junction of these resistors being connected to the junction of the anode of diode 51 and capacitor 35. An alternating current by-pass capacitor 55 shunts emitter resistor 37.

The operation of the circuit of FIG. 3 closely resembles that of FIG. 2. However, during the time that the amplitude of the alternating signal voltage at input terminal 19 is less than triggering level $v_t$, capacitor 35 is charged to a direct voltage equal to that of the quiescent direct voltage of the collector of transistor 9 multiplied by a fraction equal to the voltage division effected by resistors 53 and 54. The voltage so developed across capacitor 35 will, of course, be less than that of the collector of transistor 9 relative to the emitter, so that the net voltage across diode 51 is in a direction which prevents it from conducting. During this time a linearly amplified replica of the alternating signal voltage appears across load 13. However, as described above with reference to FIG. 2, when the amplitude of the signal voltage reaches the level $v_t$ the voltage of the collector of transistor 9 is sharply reduced. When it drops below the voltage existing across capacitor 35 diode 51 becomes conductive and the capacitor discharges through load 13 via the low resistance comprising diode 51 and the collector-to-emitter path of transistor 9 in series. An extremely large surge of voltage and current is thereby produced in the load. The duration of this pulse is limited by the time constant of the discharge path of capacitor 35, but can be made still shorter than the time required to fully discharge capacitor 35 by reducing the sizes of capacitors 8 and 45 or the resistances in their charging paths, as described above with reference to FIG. 2. That is, if either of the latter capacitors reaches its steady state charge before capacitor 35 is fully discharged, the pulse at the load will terminate at that earlier time.

In each of the circuits of FIGS. 1, 2 and 3 the voltage for rendering the described positive feedback path conductive is the same as the voltage which is actually fed back through that path. Specifically, the voltage at the collector of transistor 9 serves both of these functions. This, however, is not a necessary characteristic of a circuit constructed in accordance with the invention, since separation of these functions between two different voltages may be effected as shown in the block diagram of FIG. 4. In that figure the circuit input terminal 19 is connected by a blocking capacitor to the input terminal of an amplifier 5 which is the first in a cascade of three amplifiers 5, 7 and 9. A portion of the output of amplifier 9 established by the voltage division between resistor 15 and the parallel combination of resistor 17 and the input resistance of amplifier 5 is degeneratively fed back to the input terminal of amplifier 5. A load 13 is capacitively coupled to the output terminal of amplifier 7. Except for the connection of the load to amplifier 7 instead of to amplifier 9, this much of the circuit of FIG. 4 establishes a conventional linear cascade amplifier the same as in FIG. 1. A signal voltage applied at input terminal 19 will be linearly amplified and produced across load 13, and amplifier 9 serves to provide stabilizing negative feedback to amplifier 5.

The output terminal of amplifier 7 is also connected by a positive feedback path, which includes bias unit 21 and diode 23, to the input of amplifier 5, while the output terminal of amplifier 9 is also connected to bias unit 21. As in FIG. 1, bias unit 21 normally biases diode 23 in the nonconducting direction, thereby preventing transmission through the positive feedback path. However, when the amplitude of the signal voltage reaches a triggering level $v_t$ the output voltage of amplifier 9 overcomes the bias voltage and renders diode 23 conductive. Regeneration is then established between amplifiers 5 and 7. By constructing amplifiers 5 and 7 of transistors of opposite conductivities, as in the case of the transistors 7 and 9 in both FIG. 2 and FIG. 3, those amplifiers are then both triggered to a condition of heavy current conduction and a large amplitude pulse of current and voltage is produced in load 13.

Figure 4:
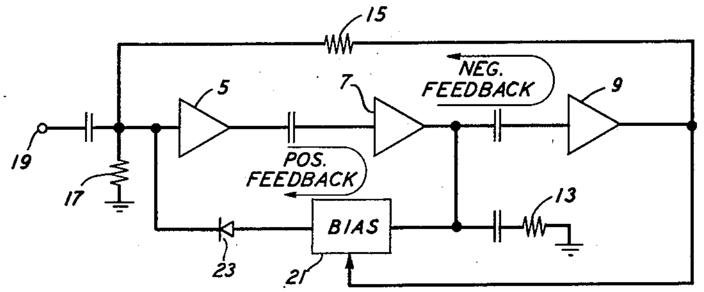
FIG. 4 is a block diagram showing the principles of another type of transistor trigger circuit constructed in accordance with the invention.

A feature of the circuit of FIG. 4 is that voltage shaping and/or controlling networks can be connected in the path between the output terminal of amplifier 9 and bias unit 21 to control the type of input signal required to produce triggering of amplifiers 5 and 7. Since this path serves only a control function, and is not a part of the regenerative feedback loop, networks placed therein would not affect the behavior of the circuit once triggering action is initiated.

Figure 5:
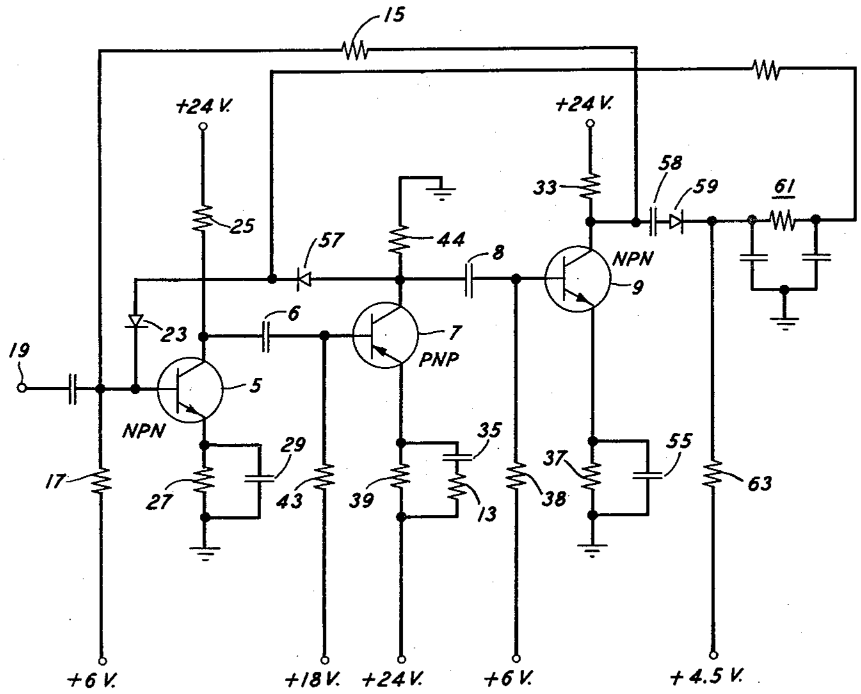
FIG. 5 is a diagram of a transistor trigger circuit constructed in accordance with the block diagram of FIG. 4.

A specific circuit constructed in accordance with the principles of the block diagram of FIG. 4 is shown in FIG. 5. This comprises three transistor amplifiers 5, 7 and 9, as in FIG. 2, and connected in cascade in the same manner as in that figure. All elements of FIG. 5 which are the same as corresponding elements of FIG. 2 have been identified with the same reference numerals. However, load 13 is here connected by coupling capacitor 35 to the emitter of transistor 7 instead of transistor 9, and emitter resistor 37 of the latter transistor is shunted by a by-pass capacitor 55 as in FIG. 3. A positive feedback path is provided in FIG. 5 between the collector of transistor 7 and the base of transistor 5, those two electrodes being connected by a pair of diodes 57 and 23 in series and poled to conduct current toward the base of transistor 5. To control this positive feedback path the collector of transistor 9 is connected by a blocking capacitor 58 to the anode of a diode 59, the cathode of diode 59 being connected through a two-stage resistance-capacitance filter 61 to the junction of diodes 57 and 23. The cathode of diode 59 is also connected through a resistor 63 to a source of +4.5 volts to ground. This voltage source and the +6 volts source together establish a net bias of 1.5 volts across diode 23 in the nonconducting direction.

If an alternating signal voltage of lesser amplitude than triggering level $v_t$ is applied to input terminal 19, the collector voltage of transistor 9 will not rise sufficiently to render diode 23 conductive. The positive feedback path then has no effect in the circuit, which behaves as a conventional cascade amplifier producing an amplified replica of the signal voltage across load 13. However, if the signal voltage amplitude reaches $v_t$, its negative half cycle will cause the collector voltage of transistor 9 to rise above +6 volts. The net voltage across diode 23 is then in the conducting direction, and results in a positive pulse being applied through filter 61 and diode 23 to the base of transistor 5. Since this pulse is derived from a negative half cycle of the signal voltage which produced it, regeneration cannot immediately occur in the feedback path between the collector of transistor 7 and the base of transistor 5. That is, during that half cycle the signal voltage tends to lower the collector voltage of transistor 7, while for regeneration the voltage at that electrode must rise. However, as a result of the time delay introduced by filter 61, the positive pulse which renders diode 23 conductive persists until the signal voltage has entered its positive half cycle. The regenerative path from the collector of transistor 7 to the base of transistor 5 then causes increasing conduction through both transistors, and an increasingly positive collector voltage of transistor 7. This process occurs very rapidly, producing a sudden large amplitude pulse of current and voltage in load 13. The pulse duration can be controlled by properly selecting the capacitance of capacitor 6 in a manner similar to that described above with reference to capacitors 8 and 45 of FIGS. 2 and 3. Once triggering has occurred, transistor 9 and its associated circuitry has no further effect until transistors 5 and 7 return to their original states.

While the described embodiments of the invention have involved cascade arrangements of three amplifiers, it is evident that any number of amplifiers could be utilized so long as a positive feedback path is provided, as described, linking at least two of the amplifiers. In addition, although in each case the load has been shown connected to the emitter of one of the transistors in the positive feedback path, obviously it could be connected to the collector of the same transistor in cases where the load impedance is large. Such variations in the described circuits embodying the invention will be apparent to those skilled in the electric circuit and transistor arts.

What is claimed is:

1. An amplifying trigger circuit comprising a pair of transistor amplifiers of opposite conductivity, each of said amplifiers adapted to normally operate in its substantially linear range, means for applying the output of a first of said amplifiers to the second amplifier, input circuit means for applying a signal voltage to said first amplifier, a load, means for applying the output of said second amplifier to said load, a positive feedback path for regeneratively transmitting the output of said second amplifier to said first amplifier, switching means connected in said path, said switching means being adapted to permit transmission through said path only after the amplitude of the signal voltage exceeds a predetermined triggering level, said amplifiers and said feedback path forming a positive feedback loop, and timing means connected in said loop for causing the regenerative transmission around the loop to be blocked at the end of a predetermined interval after the regenerative transmission begins.

2. An amplifying trigger circuit comprising a pair of transistor amplifiers of opposite conductivity, each of said amplifiers adapted to normally operate in its substantially linear range, means for applying the output of a first of said amplifiers to the second amplifier, input circuit means for applying a signal voltage to the input of said first amplifier, a load, means for applying the output of said second amplifier to said load, a positive feedback path for regeneratively transmitting the output of said second amplifier to said first amplifier, switching means connected in said path, said switching means being responsive to the output of said second amplifier to permit transmission through said path only after the amplitude of the signal voltage exceeds a predetermined triggering signal, said amplifiers and said feedback path forming a positive feedback loop, and timing means connected in said loop for causing the regenerative transmission around the loop to be blocked at the end of a predetermined interval after the regenerative transmission begins.

3. An amplifying trigger circuit comprising a pair of transistor amplifiers of opposite conductivity, means for applying the output of a first of said amplifiers to the second amplifier, input circuit means for applying a signal voltage to the input of said first amplifier, a load, means for applying the output of said second amplifier to said load, a positive feedback path for regeneratively transmitting the output of said second amplifier to said first amplifier, switching means connected in said path, said switching means being adapted to permit transmission through said path only on receipt of a switching signal, said pair of amplifiers and said feedback path forming a positive feedback loop, timing means connected in said loop for causing the regenerative transmission around the loop to be blocked at the end of a predetermined interval after the regenerative transmission begins, a third amplifier, means for applying the output of said second amplifier to said third amplifier, and means for applying the output of said third amplifier to said switching means, said third amplifier being adapted to produce a switching signal when the amplitude of the signal voltage exceeds a predetermined triggering level.

4. An amplifying trigger circuit comprising a pair of transistors of opposite conductivity, means for applying the output of a first of said transistors to the second transistor to form a cascade amplifier, input circuit means for applying a signal voltage to said first transistor, a positive feedback path for regeneratively transmitting the output of said second transistor to the input of said first transistor, switching means connected in said path, said switching means being adapted to permit transmission through said path only on receipt of a switching signal, said first and second transistors and said feedback path forming a positive feedback loop, timing means connected in said loop for causing the regenerative transmission around the loop to be blocked at the end of a predetermined interval after the regenerative transmission begins, output circuit means connected to said second transistor and to said switching means, said output circuit means being adapted to apply a switching signal to said switching means when the output of said second transistor exceeds a predetermined amplitude, and negative feedback means for connecting said output circuit means to said input circuit means to render the amplitude of the output produced by said second transistor substantially linearly related to said signal voltage until the output of said second transistor exceeds predetermined amplitude.

5. An amplifying trigger circuit comprising a pair of transistor amplifiers of opposite conductivity, means for applying the output of a first of said amplifiers to the second amplifier, input circuit means for applying a signal voltage to said first amplifier, a load, means for applying the output of said second amplifier to said load, a positive feedback path for regeneratively transmitting the output of said second amplifier to said first amplifier, switching means connected in said path, said switching means being adapted to permit transmission through said path only when the amplitude of the signal voltage exceeds a predetermined triggering level, said pair of amplifiers and said feedback path forming a positive feedback loop, timing means connected in said loop for causing the regenerative transmission around the loop to be blocked at the end of a predetermined interval after the regenerative transmission begins, and negative feedback means for interconnecting said second amplifier to said input circuit means to render the amplitude of the output of said second amplifier substantially linearly related to said signal voltage until the amplitude of said signal voltage exceeds said predetermined triggering level.

6. An amplifying trigger circuit comprising a pair of transistor amplifiers of opposite conductivity, means for applying the output of the first of said amplifiers to the second amplifier, input circuit means for applying a signal voltage to said first amplifier, a load, means for applying the output of said second amplifier to said load, a positive feedback path for regeneratively transmitting the output of said second amplifier to the input of said first amplifier, switching means connected in said path, said switching means being responsive to the output of said second amplifier to permit transmission through said path only when the amplitude of the signal voltage exceeds a predetermined triggering level, said pair of amplifiers and said feedback path forming a positive feedback loop, timing means connected in said loop for causing the regenerative transmission around the loop to be blocked at the end of a predetermined interval after the regenerative transmission begins, and negative feedback means connected between the output of said second amplifier and said input circuit means for degeneratively transmitting a constant fraction of the output of said second amplifier to said input circuit means.

7. An amplifying trigger circuit comprising a pair of transistor amplifiers of opposite conductivity, means for applying the output of a first of said amplifiers to the second amplifier, input circuit means for applying a signal voltage to said first amplifier, a load, means for applying the output of said second amplifier to said load, a positive feedback path for regeneratively transmitting the output of said second amplifier to said first amplifier, switching means connected in said path, said switching means being adapted to permit transmission through said path only on receipt of a switching signal, said pair of amplifiers and said feedback path forming a positive feedback loop, timing means connected in said loop for causing the regenerative transmission around the loop to be blocked at the end of a predetermined interval after the regenerative transmission begins, a third amplifier, means for applying the output of said second amplifier to said third amplifier, means for applying the output of said third amplifier to said switching means, said third amplifier being adapted to produce a switching signal when the amplitude of the signal voltage exceeds a predetermined triggering level, and means for degeneratively applying a fraction of the output of said third amplifier to said input circuit means.

8. An amplifying trigger circuit comprising a first transistor, a second transistor of opposite conductivity from said first transistor, input circuit means for applying a signal voltage to said first transistor, means for so connecting said first and second transistors in cascade that said second transistor produces an output voltage which is an amplified replica of said signal voltage, a positive feedback path for regeneratively transmitting the output of said second transistor to said first transistor, switching means connected in said path, said switching means being adapted to permit transmission through said path only when subjected to a switching signal, said first and second transistors and said feedback path forming a positive feedback loop, timing means connected in said loop for causing the regenerative transmission around the loop to be blocked at the end of a predetermined interval after the regenerative transmission begins, output circuit means connected to said second transistor, means for connecting said output circuit means to said switching means, said output circuit means being adapted to apply a switching signal to said switching means when the amplitude of the signal voltage exceeds a predetermined triggering level, and means for degeneratively connecting said output circuit means with said input circuit means to return a constant fraction of the output circuit voltage to said input circuit means.

9. An amplifying trigger circuit comprising a first transistor, a second transistor of opposite conductivity from said first transistor, input circuit means for applying a signal voltage to said first transistor, means for so connecting said first and second transistors in cascade that said second transistor produces an output voltage which is an amplified replica of said signal voltage, a positive feedback path for regeneratively transmitting the output of said second transistor to said first transistor, switching means connected in said path, said switching means being adapted to permit transmission through said path only when subjected to a switching signal, said first and second transistors and said feedback path forming a positive feedback loop, timing means connected in said loop for causing the regenerative transmission around the loop to be blocked at the end of a predetermined interval after the regenerative transmission begins, a load, a power source, means for connecting said load and said power source in series with the emitter-to-collector path of said second transistor, output circuit means connected to said second transistor and to said switching means, said output circuit means being adapted to apply a switching signal to said switching means when the amplitude of the signal voltage exceeds a predetermined triggering level, and negative feedback means for connecting said output circuit means to said input circuit means to feed back a constant fraction of the output from said output circuit.

10. An amplifying trigger circuit comprising a first transistor, a second transistor of opposite conductivity from said first transistor, input circuit means for applying a signal voltage to said first transistor, means for so connecting said first and second transistors in cascade that said second transistor produces an output voltage which is an amplified replica of said signal voltage, a positive feedback path for regeneratively transmitting the output of said second transistor to said first transistor, switching means connected in said path, said switching means being adapted to permit transmission through said path only when the amplitude of the signal voltage exceeds a predetermined triggering level, said first and second transistors and said feedback path forming a positive feedback loop, timing means connected in said loop for causing the regenerative transmission around the loop to be blocked at the end of a predetermined interval after the regenerative transmission begins, a load, a capacitor in series with said load, unidirectionally conductive means for connecting said load and said capacitor across the emitter-to-collector path of said second transistor, voltage dividing means connected across the emitter-to-collector path of said second transistor, means for applying a voltage developed by said voltage dividing means to said capacitor, and means for connecting said second transistor with said input circuit means in a negative feedback path to feed back a constant fraction of the output from said second transistor.

11. An amplifying trigger circuit comprising a first transistor, a second transistor of opposite conductivity from said first transistor, each of said transistors having an emitter, a collector and a base, means for connecting the collector of said first transistor to the base of said second transistor, input circuit means for applying a signal voltage to the base of said first transistor, means for causing said transistors to perform as substantially linear amplifiers until said signal voltage exceeds a predetermined level, a diode, means for connecting said diode between the collector of said second transistor and the base of said first transistor, bias means connected to said diode for normally rendering it nonconductive, said diode and said biasing means arranged so that said diode becomes conductive when the signal voltage exceeds said predetermined level, said diode and its connecting means forming a regenerative transmission path around said transistors so that said transistors and said path form a positive feedback loop, timing means connected in said loop for causing the regenerative transmission around the loop to be blocked at the end of a predetermined interval after the regenerative transmission begins, a load, and means for connecting said load to said second transistor.

12. The amplifying trigger circuit of claim 11, wherein said input circuit means is an amplifier, and further comprising a voltage divider for connecting the collector of said second transistor to said amplifier in a degenerative feedback path.

13. The amplifying trigger circuit of claim 11, wherein said output circuit means is an amplifier, and further comprising a voltage divider for connecting said amplifier to the base of said first transistor in a degenerative feedback path.

14. The amplifying trigger circuit of claim 12 wherein said timing means comprises a capacitor connected in series with said means connecting the collector of said first transistor to the base of said second transistor.

15. The amplifying trigger circuit of claim 12 wherein said timing means comprises a capacitor connected in series with said means for connecting said diode between the collector of said second transistor and the base of said first transistor.

16. The amplifying trigger circuit of claim 13 wherein said timing means comprises a capacitor connected in series with said means connecting the collector of said first transistor to the base of said second transistor.

References Cited in the file of this patent

UNITED STATES PATENTS

| | | |
|---|---|---|
| 2,651,717 | Uttley et al. | Sept. 8, 1953 |
| 2,683,806 | Moody | July 13, 1954 |
| 2,776,420 | Woll | Jan. 1, 1957 |
| 2,840,727 | Guggi | June 24, 1958 |